United States Patent [19]

Person et al.

[11] Patent Number: 5,483,692
[45] Date of Patent: Jan. 9, 1996

[54] AUTOMATIC VARIABLE RADIO VOLUME CONTROL SYSTEM

[75] Inventors: Andrew P. Person; James P. Muccioli, both of Farmington Hills, Mich.

[73] Assignee: Chrysler Corporation, Highland Park, Mich.

[21] Appl. No.: 156,127

[22] Filed: Nov. 22, 1993

[51] Int. Cl.⁶ .................................................. H04B 1/06
[52] U.S. Cl. ........................ 455/238.1; 455/232.1; 455/219
[58] Field of Search .................... 455/355, 297, 455/219, 232.1, 238.1, 345, 200.1; 381/86, 87, 107; 367/197, 198, 199; 340/825.24, 825.25; 324/166; 370/85.1, 85.2, 85.3

[56] References Cited

U.S. PATENT DOCUMENTS

| | | | |
|---|---|---|---|
| 2,080,554 | 5/1937 | Wolff | 455/238.1 |
| 3,431,498 | 12/1965 | Varterasian et al. | 455/238.1 |
| 4,476,571 | 10/1984 | Tokumo et al. | 381/57 |
| 4,942,571 | 7/1990 | Möller et al. | 370/85.1 |
| 5,018,205 | 5/1991 | Takagi et al. | 381/86 |
| 5,027,432 | 6/1991 | Skala et al. | 455/238.1 |
| 5,034,984 | 7/1991 | Bose | 381/86 |
| 5,081,682 | 1/1992 | Kato et al. | 381/57 |
| 5,081,707 | 1/1992 | Schorman et al. | 455/345 |
| 5,107,539 | 4/1992 | Kato et al. | 381/57 |
| 5,204,971 | 4/1993 | Takahashi et al. | 381/86 |

FOREIGN PATENT DOCUMENTS

| | | | |
|---|---|---|---|
| 60-261297 | 12/1985 | Japan. | |
| 3123130 | 5/1991 | Japan | 455/238.1 |

Primary Examiner—Reinhard J. Eisenzopf
Assistant Examiner—Marsha D. Banks-Harold
Attorney, Agent, or Firm—Christopher A. Taravella

[57] ABSTRACT

A multiplex bus that is corrected to an AM/FM/CD radio. The multiplex bus couples communicating microprocessors in modules, including a body computer, an engine controller, a transmission controller, and other functional components of an automobile. The radio includes components for audio amplified clipping detection and remote control of the volume. The computer controls the volume and clipping features via the multiplex bus. These features, and the programming of the computer with respect to the features are controllable by diagnostic tools external to the system, which may by hooked up to the bus in an assembly plant or an automobile service center. So programmed, the body computer is be able to read the vehicle speed, rpm, transmission gear, and acceleration and decide, in accordance with a predetermined algorithm or programmed instructions, whether to increase or decrease the radio volume. The decision depends on the vehicle characteristics and/or the preference of the prime listener.

9 Claims, 2 Drawing Sheets

AUTOMATIC VARIABLE RADIO VOLUME CONTROL SYSTEM

FIELD OF THE INVENTION

The present invention relates to an apparatus for automatically adjusting radio volume according to the speed of an automobile. More specifically, the present invention relates to an apparatus for automatically adjusting radio volume according to various parameters of an automobile, particularly as the parameters noises compete with the audio output of the vehicle's radio. The present invention also relates to a method for automatically adjusting radio volume according to the various parameters of the vehicle and the preference of the prime listener.

BACKGROUND OF THE INVENTION

Audio signals of on-vehicle audio equipment often compete with engine and other road noises in the background. As a result, the radio volume must be increased at highway speeds to overcome the road noises. After the volume is cranked up to compensate for the road noises at substantial speeds, the radio is too loud when the speed of the automobile is reduced for residential street driving or when the automobile is stopped for a traffic light. Such compensations are often required for the variety of driving conditions that a driver encounters in a single short trip. Moreover, as the affect of the audio signal output on the prime listener (either the vehicle's driver or passenger) is subjective, that is, the preferred strength of the signal is according to the preference of the prime listener, the desired increase or decrease of the audio signal in one automobile having one prime listener might differ from that of another automobile for the same or different listener.

PRIOR ART

One prior art approach to overcoming this problem is disclosed by Masahiro Kajiki in Japanese patent document No. 123130. Kajiki discloses an audio volume level control system that controls a telephone loudspeaker. The apparatus senses only vehicle speed and compensates only for this parameter.

Another approach is disclosed by Norio Hayashi in Japanese patent document No. 261297. Hayashi discloses a vehicle radio volume control system utilizing a hardwired controller. A sensor, such as an engine rotation speed sensor, triggers a two-state detection means. The automatic volume controller, as disclosed Hayashi, varies the sound volume with the variance of noise.

U.S. Pat. No. 5,018,205, issued to Takagi et al., discloses an automobile sound level compensator that increases or decreases the level of sound depending on the noise reduced from the vehicle movement As with Hayashi, Takagi discloses a vehicle radio volume control scheme that utilizes hardwired discrete components.

U.S. Pat. No. 5,027,432, issued to Skala et al., discloses a volume control scheme which includes a storage memory. The various volume settings are manually set by the vehicle driver for various speeds such as 30, 50, 75 mi/hr then stored in memory The volume settings as predetermined by the driver continue to be emitted as long as the speed of the car is between two given speed settings.

U.S. Pat. No. 5,204,971, issued to Takahashi et al., discloses an automatic radio volume control system that uses an algorithm or programmed instructions which accesses various audio volume level tables stored in an EEPROM. The basic input parameter utilized by Takahashi et al. is a microphone that detects noise levels.

U.S. Pat. No. 3,431,498, issued to Varterasin, discloses an automatic audio control system using temperature sensitive component parts placed in air flow such that a change in the temperature is proportional to the speed of the automobile.

U.S. Pat. No. 5,081,682 and U.S. Pat. No. 5,107,539, issued to Kato et al., disclose systems that utilize microprocessors to output volume controlling signals. These microprocessors do not receive digital data.

U.S. Pat. No. 5,034,984, issued to Bose, discloses an automatic on variable gain, audio volume control system that increases audio volume based on vehicle speed. Bose utilizes discrete hardwired analog components.

U.S. Pat. No. 4,476,571, issued to Tokumo et al., discloses a radio volume control circuit comprised of discrete analog components. Tokumo et al. are concerned with eliminating abrupt changes in audio volume level by use of a series of filter and amplifier stages.

U.S. Pat. No. 2,080,554, issued to Wolff, discloses a speed responsive audio volume control system with a wind driven sensor for determining vehicle speed. The system of Wolff uses discrete hardwired analog components.

None of the above solutions provide for the subjective preference per prime listener or per vehicle. Most do not compensate for all of the various factors contributing to noises in compensation with the desired audio output. As one example, a system that varies the audio output in accordance with the vehicular speed might not compensate for engine noises when the vehicle is at a standstill.

SUMMARY OF THE INVENTION

An object of the present invention is to provide an automatic variable radio volume control system that adjusts the radio volume depending on various factors contributing to competing cabin noises, such as engine revolution, transmission operation, and automobile speed.

In order to achieve the above object, there is provided a multiplex bus that is connected to an AM/FM/CD radio. The multiplex bus, which reduces wiring interconnects and improves reliability in a diagnostic system, couples communicating microprocessors in modules, including a body computer, an engine controller, a transmission controller, and other functional components of an automobile. The radio includes components for audio amplified clipping detection and remote control of the volume. The body computer controls the volume feature via the multiplex bus. This feature, and the programming of the computer with respect to the feature is controllable by diagnostic tools external to the system, but which may by hooked up to the bus in an assembly plant or an automobile service center. So programmed, the body computer is able to read the vehicle speed, rpm, transmission gear, and acceleration and decide, in accordance with a predetermined algorithm or programmed instructions, whether to increase or decrease the radio volume. The decision depends on the vehicle characteristics and/or the preference of the prime listener. The body computer will then send a message on the bus for the radio to increase or decrease volume in fixed steps. The radio will read the bus message and adjust the volume accordingly.

The automatic variable radio volume control system can be turned "ON" or "OFF" via the bus at a repair maintenance shop during a diagnostic readout of the computerized components of the automobile. The "ON"/"OFF" status of the automatic variable radio volume control system is stored in EEPROM, the non-volatile memory.

BRIEF DESCRIPTION OF THE DRAWINGS

Other objects, features, and advantages of the present invention will become more fully apparent with the following detailed description of the preferred embodiment, the appended claims, and the accompanying drawings in which:

DETAILED DESCRIPTION OF THE PREFERRED EMBODIMENTS

Figure 1:
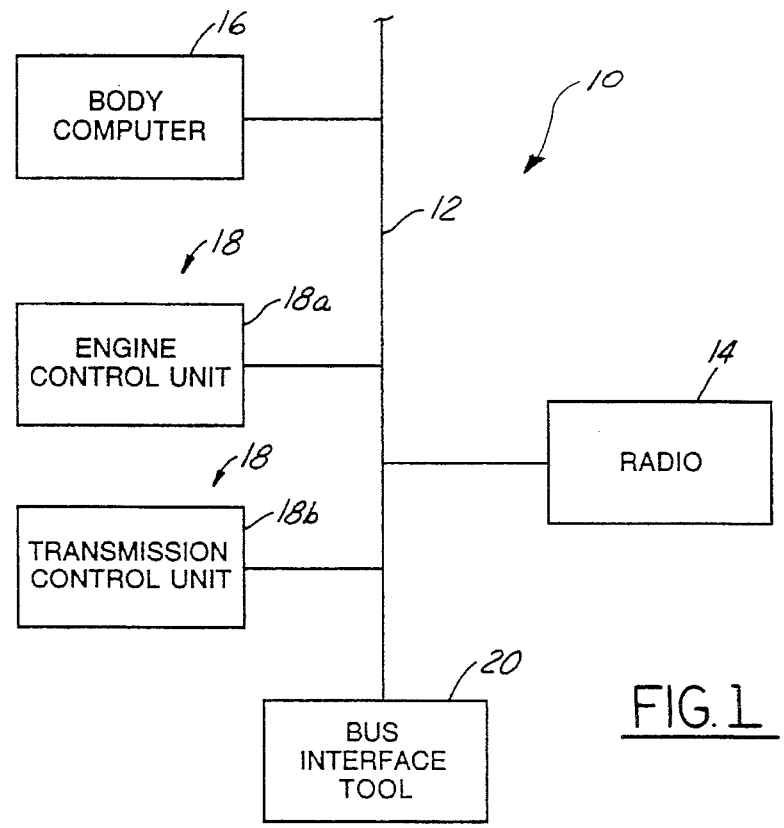
FIG. 1 is a block diagram of an automatic variable radio volume control system made in accordance with the teachings of the preferred embodiment of this invention.

Referring now to the drawings, wherein like reference numerals are used to identify identical components in various views, FIG. 1 is a block diagram depicting an automatic radio volume control system 10 made in accordance with the teachings of the preferred embodiment of this invention. The system is contained within a vehicle (not shown). Extending throughout the vehicle is a multiplex bus 12 which functions to control and monitor functional components of the automobile for purposes other than to accomplish the objects of the present invention, but which may be utilized for such purposes.

As shown, the automatic radio volume control system 10 includes the multiplex bus 12. As a part of the automatic radio volume control system 10, the bus is coupled to an automotive audio unit such as a radio 14. The radio 14 may have such standard features as AM and FM bands and tape and CD players.

Via the bus 12, the radio is coupled to a body computer 16. The radio 14 and body computer 16 are also coupled to various other automotive modules 18 which control and/or monitor various utilities of a vehicle, such as the engine and transmission.

The multiplex bus 12 preferably uses differential two wire twisted pairs of a style known to those of ordinary skill in the automotive electrical arts so that standard automotive connectors and automotive modules may be used and standard automotive assembly plant procedures may be maintained.

The multiplex bus 12 allows data to be efficiently transferred between modules 18 and the radio 14 via a communication protocol having a predetermined message format. A bus interface tool 20 allows a user to access the multiplex bus 12 so that an appropriate formatted bus message can be sent to and received by the radio 14, the body computer 16, and/or the modules 18, for diagnostic purposes, as is known in the art. This feature, as will be explained, also may be used to program the automatic radio volume control system for a particular vehicle and for the particular preferences of a prime listener.

The body computer 16 monitors various predetermined parameters of the modules 18, such as vehicle speed, rpm, transmission gear, and acceleration. Each of the modules 18 can be added and deleted with little or no impact on the bus 12 without affecting the other modules 18 connected to the bus 12, other than to affect the other modules 18 due to added message volume or protocol. Information from one module 18 may be used by other modules 18 to eliminate the need for sensors and associated wiring circuits. For example, information from the engine control unit 18a when it is in wide open throttle communicates that the vehicle is attempting maximum acceleration. Such information may be used by a module (not shown) measuring fluid levels or by modules (not shown) trying to level the vehicle or by a transmission control module 18b selecting gears in anticipating the engine's needs.

Nodules 18 may be used to talk to each other for purposes of diagnosing faults. The common bus 12 used throughout the vehicle is used by assembly plants and service centers of dealers to communicate with a common piece of test equipment via the bus interface tool 20. Hardware and software included in each module 18 provides for pre,defined bus diagnostic messages that are different for each specific module 18.

Figure 2:
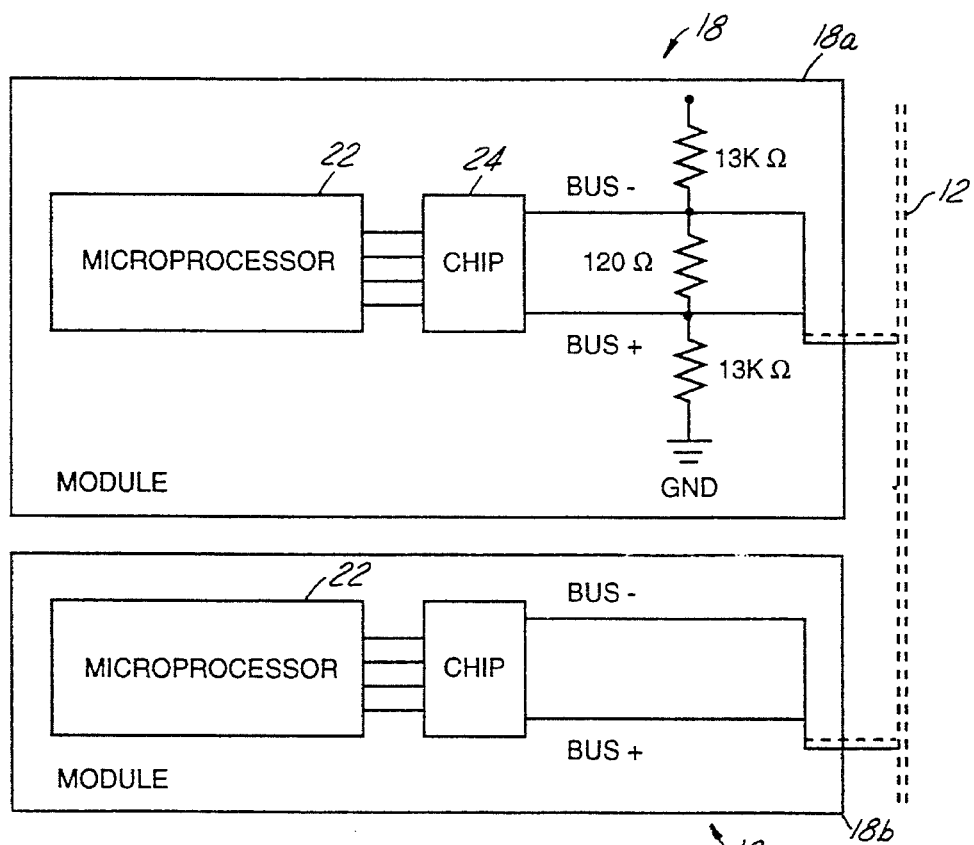
FIG. 2 is a block diagram of modules in accordance with the present invention.

With reference now to FIG. 2, the modules 18 are connected in parallel to the bus 12. Each module 18 has a microprocessor 22 that can transmit, receive, or both transmit and receive messages sent over the bus 12. A bus interface integrated circuit or chip 24 provides access to the microprocessor 22 for the various bus messages (data) transmitted and received along the multiplex bus 12. The Input/Output cell of the chip 24 supports full duplex access to the bus 12 and nondestructive arbitration (the process of obtaining control and sole access to the bus 12). So as not to degrade proper data transfers, at least one resistor 26 must be used at least one end of the bus 12. The characteristic impedance of the vehicle's wiring may require that reflected waves be minimized by use of a resistor 26 at least one end of the bus 12.

Figure 3:
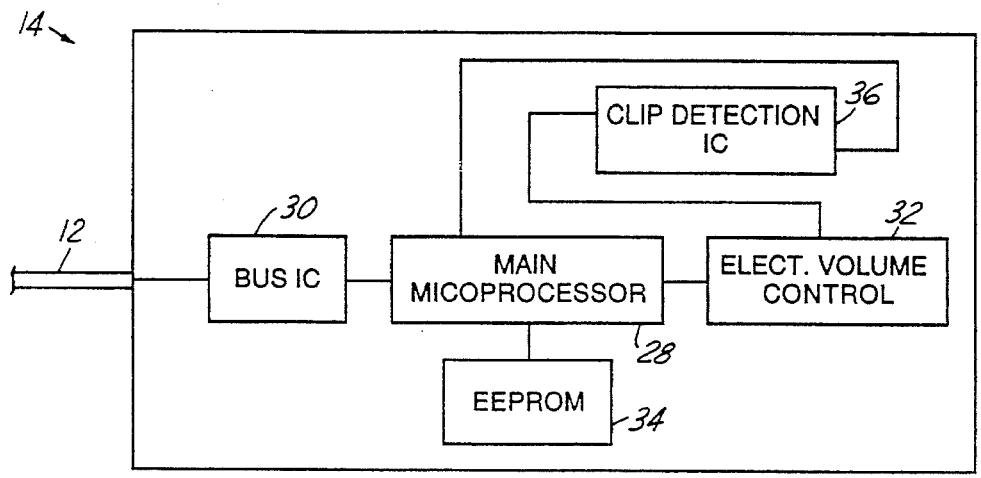
FIG. 3 is a block diagram of a radio in accordance with the present invention.

Referring now to FIG. 3, the radio 14 has a main microprocessor 28. A bus interface integrated circuit 30 provides access to the main microprocessor 28 of the radio 14 for the various bus messages transmitted and received along the multiplex bus 12 between the body computer 16 and the modules 18, using the predetermined message format. The microprocessor 28 of the radio 14 is also coupled to an electronic volume control integrated circuit 32, known to those of ordinary skill in the art to allow control of the volume by connection to a control unit remote from the radio 14. The bus 12 provides for the connection to the remote control unit, which is the body computer 16. An Electrically Erasable Programmable Read-Only Memory (EEPROM) integrated circuit 34 is also coupled to the microprocessor 28 for storing the ON/OFF status of the automatic radio volume control system 10. Clip detection circuit 36 coupled to the microprocessor 28 and the electronic volume control integrated circuit 32. The clip detection circuit 36 monitors the volume adjustment for clipping or distortion. If clipping occurs, the clip detection circuit 36 sends a clip detection signal to microprocessor 28 which in turn will adjust the volume accordingly to a predetermined clip detection algorithm.

The radio volume control is controllable via the bus 12 by the body computer 16, which is able to read the parameters monitored by the various modules 18 through the bus 12 and to decide the radio volumes increase or decrease by a predetermined algorithm programmed into the body computer on the basis of the vehicle's characteristics. During a regular visit to an automobile service center for diagnostic testing of the automobile's electronic parts, programming may be accomplished via the bus interface tool 20 used for the diagnostic testing. The tool 20 allows a user access to the multiplex bus 12 so that the appropriate formatted bus message that turns the automatic variable radio volume control system 10 ON or OFF can be sent to and received by the bus interface integrated circuit 30. The computer may be programmed with the algorithm or instructions in accordance with the prime listener's preferences as the various controllers of the modules 18 are activated and monitored during diagnostic testing.

Figure 4:
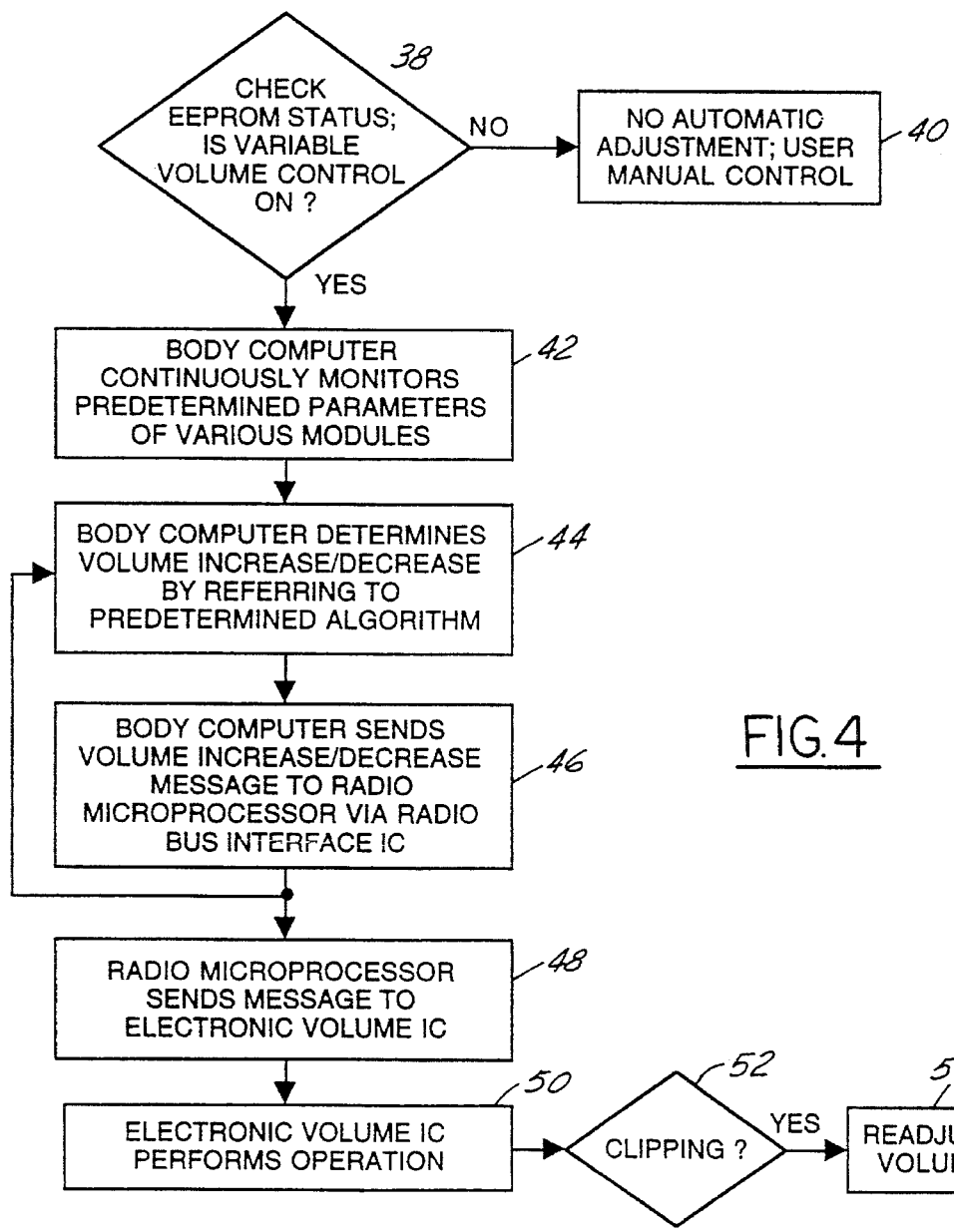
FIG. 4 is a flow chart illustrating the general sequence of steps associated with the operation of the system found in FIG. 1.

Operations of the automatic radio volume control system 10, shown in the block diagram of FIG. 1, will now be described according to the flow chart in FIG. 4. A general sequence of steps are associated with the use of the automatic variable radio volume control system 10.

In a first step 38, the status of the EEPROM integrated circuit 34 is checked to determine if the automatic variable radio volume control system is ON or OFF. If the automatic variable radio volume control system is not ON then, in accordance with step 40, the user must manually adjust the volume of the radio 14.

If the automatic variable radio volume control system is ON, step 38 is followed by step 42 in which the body computer 16 continuously monitors the predetermined parameters of the various modules 18. In step 44, the body computer 16 determines the amount of volume increase or decrease to be performed, by referring to the predetermined algorithm programmed according to the vehicles characteristics (and perhaps the driver/passenger's preference). If the body computer 16 determines that the volume should be increased, step 46 follows step 44. In step 46 the body computer 16 sends the volume increase or decrease message to the radio microprocessor 28 via the bus interface integrated circuit 30.

Next, according to step 48, the microprocessor sends the volume increase or decrease message to the electronic volume control integrated circuit 32. In step 50, the volume is increased or decreased accordingly by the electronic volume control integrated circuit 32.

Finally in step 52, the microprocessor is polled to determine if clipping is occurring. If clipping is occurring, the volume is not increased further, according to step 54. If clipping is not present, no further action is taken.

Considered in a broader aspect, the volume control system above-described provides means for controlling the sound output of a radio by a controlled action that is proportional to the various parameters of a vehicle.

We claim:

1. An automatic variable radio volume control system for a vehicle, they system comprising:

at least one module including microprocessor means for controlling and monitoring a utility of the vehicle and sending informational signals about the controlling of said utility;

a vehicle multiplex bus coupled to said at least one module for transferring said informational signals over said multiplex bus;

programmable computer means coupled to said multiplex bus and responsive to said informational signals for deciding a radio volume by a predetermined algorithm and for sending a volume message on said multiplex bus; and an audio unit coupled to said multiplex bus, said audio unit including means responsive to said volume message for controlling sound output from said audio unit in accordance with said volume message.

2. The vehicle automatic variable radio volume control system of claim 1, wherein said means for controlling sound output includes an electronic volume control integrated circuit.

3. The vehicle automatic variable radio volume control system of claim 2, wherein said audio unit includes a microprocessor and a bus interface for providing access to said multiplex bus for said microprocessor.

4. The vehicle automatic variable radio volume control system of claim 1, wherein said at least one module is a multiplicity of modules.

5. The vehicle automatic variable radio volume control system of claim 4, wherein said multiplicity of modules includes modules to control vehicle speed, rpm, transmission gear, and acceleration.

6. The vehicle automatic variable radio volume control system of claim 5, wherein said multiplicity of modules further includes modules to measure fluid levels.

7. The vehicle automatic variable radio volume control system of claim 1, wherein said vehicle automatic variable radio volume control system has an ON/OFF status associated therewith and said audio unit further includes non-volatile memory for storing said ON/OFF status.

8. A method of controlling radio volume to the preference of a prime listener in a vehicle having a plurality of modules for controlling and monitoring utilities of the vehicle, said modules being coupled by a multiplex bus to a programmable body computer and to a radio installed in the vehicle, the method comprising the steps of:

accessing said bus with a electronic diagnostic tool;

controlling said modules with said diagnostic tool using said bus while increasing and decreasing the radio volume to the preference of said prime listener to correlate, in steps, signals associated with levels of the control of said modules with levels of the radio volume; and programming said body computer with instructions to increase and decrease the volume of the radio in accordance with correlated levels of the control of said modules.

9. The method of claim 8, wherein said radio has an automatic variable radio volume control system that has an ON/OFF status stored in non-volatile memory, the method further comprising the step of turning the radio volume control system ON using said diagnostic tool whereby the radio volume is controlled in steps according to the correlated levels of the control of said modules.

* * * * *